US008123868B2

(12) United States Patent
Devitt

(10) Patent No.: US 8,123,868 B2
(45) Date of Patent: Feb. 28, 2012

(54) METHOD AND APPARATUS FOR IN-LINE PROCESSING AND IMMEDIATELY SEQUENTIAL OR SIMULTANEOUS PROCESSING OF FLAT AND FLEXIBLE SUBSTRATES THROUGH VISCOUS SHEAR IN THIN CROSS SECTION GAPS FOR THE MANUFACTURE OF MICRO-ELECTRONIC CIRCUITS OR DISPLAYS

(75) Inventor: Andrew J. Devitt, Media, PA (US)

(73) Assignee: New Way Machine Components, Inc., Aston, PA (US)

( * ) Notice: Subject to any disclaimer, the term of this patent is extended or adjusted under 35 U.S.C. 154(b) by 0 days.

(21) Appl. No.: 12/699,594

(22) Filed: Feb. 3, 2010

(65) Prior Publication Data
US 2010/0282271 A1  Nov. 11, 2010

Related U.S. Application Data

(62) Division of application No. 11/497,526, filed on Aug. 2, 2006, now abandoned.

(60) Provisional application No. 60/704,453, filed on Aug. 2, 2005.

(51) Int. Cl.
*B08B 3/02* (2006.01)
*B08B 3/12* (2006.01)

(52) U.S. Cl. .......... 134/36; 118/313; 118/314; 118/316; 118/325; 118/500; 134/25.5; 134/34; 134/51; 134/151; 134/198; 216/37; 248/363; 248/636; 406/88; 406/91; 406/197; 414/197; 427/424

(58) Field of Classification Search ............ 134/34, 134/1, 25.5, 50, 51, 122 R; 156/345.1, 345.11, 156/345.17, 345.2, 345.23, 345.51, 345.54; 118/50, 314, 315, 500, 503, 718; 216/37; 248/363, 631, 636; 406/88, 91, 92; 414/767
See application file for complete search history.

(56) References Cited

U.S. PATENT DOCUMENTS

| 3,223,501 A | 12/1965 | Fredley et al. |
| 3,665,730 A | 5/1972 | Linzer |
| 4,186,918 A | 2/1980 | Ficker et al. |

(Continued)

FOREIGN PATENT DOCUMENTS
DE        19836527       2/2000
(Continued)

OTHER PUBLICATIONS

The State's University, Basic Definitions, Oklahoma State University, 2006 (1 pg).

*Primary Examiner* — Michael Cleveland
*Assistant Examiner* — Alexander Weddle
(74) *Attorney, Agent, or Firm* — Blank Rome LLP

(57) ABSTRACT

A method and apparatus for cleaning, drying, coating, baking etching and deposition of surfaces on glass substrate as it transitions thru and between small gaps between hydro-static porous media bearings. Due to the non-contact nature of the device extremely high pressures can be induced upon the work piece through various fluids without damage to the substrate, allowing the system to utilize the viscous nature of fluids to accomplish the desired cleaning, drying, coating, etching or baking. The process also allows for simultaneous and immediately sequential ordering of processes.

25 Claims, 6 Drawing Sheets

U.S. PATENT DOCUMENTS

| | | | |
|---|---|---|---|
| 4,618,292 A | 10/1986 | Judge et al. | |
| 4,663,197 A * | 5/1987 | Bok | 427/255.5 |
| 4,749,283 A | 6/1988 | Yokomatsu et al. | |
| 4,785,985 A | 11/1988 | Hurtgen | |
| 5,078,775 A | 1/1992 | Maltby, Jr. et al. | |
| 5,104,237 A | 4/1992 | Slocum | |
| 5,133,561 A | 7/1992 | Hattori et al. | |
| 5,246,331 A | 9/1993 | Hallahan et al. | |
| 5,343,616 A | 9/1994 | Roberts | |
| 5,423,468 A | 6/1995 | Liedtke | |
| 5,488,771 A | 2/1996 | Devitt et al. | |
| 5,675,856 A | 10/1997 | Itzkowitz | |
| 5,730,801 A | 3/1998 | Tepman et al. | |
| 6,013,375 A | 1/2000 | Maltby, Jr. et al. | |
| 6,101,845 A | 8/2000 | Kojima et al. | |
| 6,149,759 A * | 11/2000 | Guggenberger | 156/345.51 |
| 6,163,033 A | 12/2000 | Smick et al. | |
| 6,220,056 B1 | 4/2001 | Ostendarp | |
| 6,281,136 B1 | 8/2001 | Kim | |
| 6,515,288 B1 | 2/2003 | Ryding et al. | |
| 6,540,001 B1 | 4/2003 | McNestry | |
| 6,564,421 B2 * | 5/2003 | Park et al. | 15/302 |
| 6,593,952 B1 | 7/2003 | Funayama et al. | |
| 6,644,703 B1 | 11/2003 | Levin et al. | |
| 6,781,684 B1 | 8/2004 | Ekhoff | |
| 6,810,297 B2 | 10/2004 | Adin et al. | |
| 6,869,484 B2 | 3/2005 | Hunt et al. | |
| 6,899,765 B2 | 5/2005 | Krivts et al. | |
| 6,932,873 B2 | 8/2005 | Rechav et al. | |
| 2002/0135761 A1 * | 9/2002 | Powell et al. | 356/316 |
| 2003/0169524 A1 | 9/2003 | Adin et al. | |
| 2003/0177790 A1 | 9/2003 | Langsdorf et al. | |
| 2004/0003829 A1 * | 1/2004 | Hirae | 134/1.3 |
| 2005/0050760 A1 | 3/2005 | Itoh | |
| 2006/0060259 A1 | 3/2006 | Devitt | |
| 2007/0031600 A1 | 2/2007 | Devitt | |
| 2007/0175499 A1 | 8/2007 | Yassour et al. | |

FOREIGN PATENT DOCUMENTS

| | | | |
|---|---|---|---|
| WO | 9961678 A1 | 12/1999 | |
| WO | 03/060961 | 7/2003 | |
| WO | WO 03060961 A1 * | 7/2003 | |
| WO | 2004/089792 | 10/2004 | |
| WO | 2007016688 A1 | 2/2007 | |

* cited by examiner

METHOD AND APPARATUS FOR IN-LINE PROCESSING AND IMMEDIATELY SEQUENTIAL OR SIMULTANEOUS PROCESSING OF FLAT AND FLEXIBLE SUBSTRATES THROUGH VISCOUS SHEAR IN THIN CROSS SECTION GAPS FOR THE MANUFACTURE OF MICRO-ELECTRONIC CIRCUITS OR DISPLAYS

REFERENCE TO RELATED APPLICATIONS

The present application is a divisional of U.S. patent application Ser. No. 11/497,526, filed Aug. 2, 2006, now abandoned, which claims the benefit of U.S. Provisional Application No. 60/704,453, filed Aug. 2, 2005. The disclosures of the above-referenced applications are hereby incorporated by reference in their entireties into the present disclosure.

FIELD OF INVENTION

The present invention relates to a cleaning, drying, coating, baking and etching apparatus for the "Flat Panel Display" (FPD) glass industry, architectural window elements, solar elements, as well as the precision panel substrate elements, film substrate industry, integrated circuit, and panel circuit boards of the semi-conductor industry, also as such other like devices and substrates arise, the usefulness of the present invention in those applications will be readily apparent.

DISCUSSION OF THE RELATED ART

In the FPD industry ever larger sheets of glass are being employed in the manufacture of Flat Panel Displays. The processing of these sheets is expensive in that their increasing size makes handling difficult regarding the brittle nature of the glass, due to its thin cross section—precluding anything but the gentlest method of transference. Because the required surface finish is intolerant of any type of defect or contamination manufacturers are increasingly moving towards non-contact conveyance of the panels in handling and processing in order to increase the yield rate. The manufacturing process of the substrate sheets of glass require many operations before they can be integrated with other components. In order for the substrates to perform properly, they must be processed to a high degree of accuracy. This would include cleaning from contamination, streaking and marks, drying, and either coating any number of different ways, or etching to induce desired patterning properties.

Because the handling and processing of FPD glass is so similar to wafers and circuit boards and other elements inherent in the semi-conductor industry, it is anticipated by the inventor that this method and/or apparatus and invention is directly transferable and translatable to the semiconductor industry and its attendant requirements of manufacturing production. Also the usefulness of the invention when processing flexible film substrates should be readily apparent.

Cleaning

In the process of cleaning substrates, traditionally the method utilized in the semi-conductor area, as well as the FPD industry—substrates are held in place while nozzles pass over the surface dispensing water in copious amounts with various cleaning solutions. The force of the cleaning solution spraying on the substrate is increased in order to attempt to use the viscous shear of the water due to its surface tension in order to loosen particles or contaminants adhered to the glass. The process of cleaning is open and dependant upon the level of cleanliness within the clean room, since any particles falling in the air will land and possibly mar the surface. Also, the cleaning solution can be sprayed and or applied via foam rollers which are also used to gently scrub the glass via contact. See U.S. Pat. No. 5,675,856 Itzkowitz, herein used as a reference. This induces errors into the glass surface, though small, due to its contact nature; however this is occasionally desirable due to the polishing effect thereby created. However, due to the atmosphere of the clean room having a very low level of humidity the process engenders streaking due to the cleaning solution drying on the glass surface prior to being rinsed, creating undesirable glass streaks and further issues with glass quality which degrade quality.

When cleaning semiconductor silicon wafers, a similar process is employed in that nozzles are passed over the substrate surface dispensing copious amount of water and cleaning solution in an effort to dislodge particulate contamination. However, since the wafers are round, the disc is spun, in order to create a centrifugal force and fling the water off the surface in an effort to use the viscous shear effect of the water on the substrate as it is forced to slide over the surface. This process also experiences the same elemental problems as the cleaning process described above, in that the clean room environment has very low humidity, causing quick drying and the creation of streaks on the substrate surface. Also, the water being flung off the surface of the wafers edge impinges the retaining wall of the wafer enclosure, atomizing the water droplets, and causing them to reattach to the wafer surface subsequently drying and causing water spots. This process of utilizing water essentially poured over the surface is not entirely efficacious, allowing streaks, spots and other visual defects to remain. This causes serious problems within the production framework, causing slowdowns and lost revenue due to production delays.

Etching

In the manufacture of precision tolerance substrates including the FPD glass industry as well as the semi-conductor industry the need arises to remove material and or to chemically change the surface quality or thickness of the substrate. The use of etchants of various sorts and types is a viable means of changing the substrate surface and or chemically removing material for thickness qualifications. The handling of chemicals is difficult since the substrates involved require careful support as well as the fact that etchants are chemically reactive and so often caustic and dangerous to administer and contain. Conventionally, the most useful method of applying etchings is by soaking the substrate in a container having an etchant and applying a force. There are inherent problems in this method in that the impurities within the etchant are allowed to remain on the surface of the substrate so that the surface of the substrate requires further remediation to correct what the etching process produces. A methodology to further improve upon this process is to set the substrate in a container having an etchant and then direct bubbles generated from an outside source onto the surface of the substrate that is immersed in the etchant, thereby using the force of the bubbles to clean and etch the surface of the substrate as in U.S. Pat. No. 6,281,136 B1 Kim enclosed herewith as reference. This process is time consuming and difficult to apply the bubbles evenly since there is no way to constrain the force of the bubbles uniformly, thereby the surface of the substrate is left with varying thicknesses which can cause further quality issues regarding the end product of the process.

Another problem inherent in the process of etching is the transference of the substrate into the tank with the etchant, the subsequent handling of the substrate and the etchant material, and the overall environment created with tanks, sprays and the necessary equipment required to process said steps effectively within the clean room environment.

Another method for Etching is the impingement of the substrate through some means as sand, glass beads or baking soda. This process engenders the need for further cleaning.

Drying & Baking

During a cleaning process involving water upon a substrate or device requiring such high tolerances as are required in the FPD and semiconductor industries the substrate will need to be dried. Critical to this process is no remaining moisture on the surface, and also to insure that there is no streaking and or impurities remaining on the surface of the substrate due to their presence in the cleaning solution which has then evaporated away, leaving them behind. Further, there are some processes within the aforementioned industries that require a baking process. This entails a higher order of heat and or application of radiant heat and light to enhance a process, or complete a curing of a coating, or similar elements.

Conventional drying for FPD glass involves heating and placing the substrate within a chamber and causing the substrate to dwell there, while a heat source is applied to remove any moisture. Problems associated with un-even heating arise in that if the heat source is not applied evenly to the substrate surface, warping and or variations in the surface quality can occur, as well as areas where there is more rapid evaporation of the rinse water from the cleaning process, leaving behind streaks and or water spots.

Still further, baking presents problems to the cleanliness of the clean room environment, since the presence of high heat sources can create unwanted particulate and contamination in clean room environments through the opening and closing of the chamber used to heat the substrates.

Within the semi-conductor industry discreet chambers are used where the wafers can be dried, or baked. The substrate must be moved to those chambers Likewise in the FPD market, drying is usually accomplished as part of the cleaning process in separate drying and baking chambers.

Coating

Various means of coating are employed in industry. A common method for coating is to pass the substrate beneath a curtain of material which deposits a material upon the substrate in an even thickness, or to have a type of "Shower head" which deposits an even layer of material on the substrate. This is unsatisfactory since the thickness of the coating and the processing parameters need to be controlled for precision applications, also since the size of the apparatus required for ever larger generations of glass is prohibitive, since such equipment must be operated in a clean room environment. Substrates can be dipped and or sprayed as well—neither of which is suitable for FPD glass, or semi-conductor industry products due to handling issues.

SUMMARY OF THE INVENTION

Accordingly, the present invention is directed to a method and apparatus utilizing the viscous shear force of aerostatic or hydrostatic fluids for cleaning, drying, baking, and etching glass substrate and semiconductor industry flat panel substrates that substantially obviates one or more of the problems due to limitations and disadvantages of the related art.

An object of the present invention is to provide a method and apparatus for cleaning, drying, coating, baking, and etching glass and semi-conductor substrates having a thin thickness and semi-uniform surface contained within an apparatus that allows for in-line processing and or controlled mini-environments for especially large panels.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

Cleaning

In order to achieve these and other advantages and in accordance with the purpose of the present invention, in the preferred embodiment and broadly described, the apparatus for cleaning contains two horizontal inline and vertically opposed porous media air or fluid bearings, substantially wider and longer than the selected substrate, with a plurality of holes and gas passages through which air or fluid can be forced from behind the porous media from within the housing used to fixture the porous media, the porous media being sealed on its edges to maintain the fluidic pressure behind it, so that air or the desired fluid only flows through the porous media face. The method of constraining the substrate could possibly be achieved through the use of orifice, capillary, and step type bearings, using any number of different types of fluids.

Through another means, not here detailed, the FPD glass or such other substrate is propelled through the processes in such a manner that does not interfere with the various processes mentioned or interfere with the quality of said substrate in the final state of its manufactured embodiment.

The opposed bearings are situated each horizontally and vertically opposed to one another and parallel to one another in such a way so as to create a thin gap large enough to allow the substrate plate to pass between them. With the substrate inserted between the parallel porous bearings a thin gap is then created between the substrate and the porous media itself. Air or fluid, in this case air is forced from the porous media through a plurality of holes and impinges against and upon the substrate, from both opposing sides, causing the substrate to remain static between the two bearings in a non-contact disposition to the porous media. Should there be a displacement of the substrate, towards one or the other bearings—there is a natural equalizing force enacted, in that the gap that has grown larger now represents a lower pressure, consequently the gap that is now smaller creates a larger pressure, thereby forcing the substrate back into equilibrium. Since the pressure is then equal on both sides of the substrate, there is no deflection or danger of breaking the fragile substrate; however this pressure on the substrate is greater than atmospheric, causing air to flow out the thin gap between the substrate and porous media. This flow displaces loose particles and dust, and prevents further contamination from entering the area between the porous media.

Some distance into the apparatus, there are two sets of grooves recessed in the bearings perpendicular to the substrate motion and substantially spanning the full width of the substrate. The second set of grooves supplying a water or surfactant, solvent, de-ionized water, or some other such cleaning solution onto the substrate—with equal and opposed pressure to one another so that the pressure on the substrate is equal on both sides. These grooves act as hydrostatic bearings and operate on the cleaning solution itself insuring that the substrate is completely without contact except for the cleaning solution. The first set of grooves having a substantially lower pressure than the second set, causing the cleaning solution to be forced from the second groove back against the direction of the substrate motion into the first groove. Because the cleaning solution is being forced to flow along the substrate, in the opposite direction of substrate movement, through a very small cross section being formed by the distance between the substrate and the porous media, there is a substantial amount of force being applied to the surface of the substrate via the fluid. This substantial force uses the viscous shear of the cleaning solution and the high pressure gradients produced by the thin cross section of gap between the substrate and the porous media bearings to affect a cleaning action. Since the first groove has a substantially lower pressure than the second groove, the cleaning solution is completely evacuated by the substantially lower pressure groove, essentially removing the excess cleaning solution from the groove, and also the substrate. Very little actual cleaning solution is required and it is constrained by the seals formed via the porous media bearings, insuring that no particulation or contamination is allowed into the process from externally, as well as insuring that there is no leakage of cleaning solution or contaminates from within the cleaning apparatus to the clean room environment.

In another embodiment, an ultrasonic head can be mounted in-between the first axial groove, and the second. The land formed by the head of the ultrasonic cleaner will be immersed in the cleaning solution that is being forced from the second axial groove, back into the first. The water contact allows the ultrasonic head to induce a vibratory action that aides in the cleaning of particulate from the substrate surface. The head is completely enclosed, and in close contact, so along with the viscous shearing action of the cleaning solution the substrate, an ultrasonic wave form is emanated from the head in close proximity, focusing directly on the substrate surface, further aiding in the cleaning action.

A further embodiment is for the application of semi-conductor industry substrates, namely silicon wafers. The processes described for FPD glass are substantially similar to semi-conductor wafers. However wafers are traditionally circular in shape, which prove difficult to process across straight lands, and grooves. For that reason, a particular embodiment of the present invention entails creating a significantly curved series of grooves and lands, substantially similar to the radius of the wafer to be processed. In this way, the curved leading edge of the wafer will experience the forces inherent in the process simultaneously. It is perceived that this will accommodate the specific requirements of the wafer industry, and experimentation with various radii can be adapted to suit a viable process.

Still a another benefit to the described invention is the fact that the cleaning solution can be recycled, and re-used, saving money and time. However a further benefit is the fact that caustic cleaning agents and the like require local, state, and Federal monitoring and inventory, so that processors must give an account of the disposition of cleaning agents. With the current described process completely self contained, and all the cleaning agents accounted for, compliance with regulation is perceived by the inventor as significant improvement on the current art.

Drying

In another aspect to the cleaning process described above and substituting cleaning solution for hot air. The pre-heated dry air is forced to impinge upon the substrate, flowing towards the lower pressure axial groove previously illustrated. The flow of the heated dry air, or some other fluid or gas, is against the direction of the movement of the substrate, thereby utilizing the viscous shear of the fluid to effectively push any residue or moisture still remaining on the glass, from say, the cleaning process—back towards the lower ambient pressure axial groove. The process can be repeated as required within the apparatus to insure complete drying of the substrate.

Chemical Etching

In another aspect, utilizing the above process—a chemical caustic etchant material can be substituted for the cleaning solution. The size of the gap between the hydrostatic bearing, which is a bearing that can be used for fluid or for gas, and the glass can be modulated, and the pressure differential between the axial grooves can be adjusted to decrease or increase the flow rate of the etchant to achieve the desired chemical surface changes to the substrate. Depending on the particular type of etchant, and the desired through put of the apparatus, the length between the first and second axial grooves can be adjusted to allow for more contact time of the etchant and the substrate. There can also be modulated cleaning steps after the etchant has been supplied as desired. Nozzles can be strategically placed within the axial grooves in order to induce a pattern as may be desired.

The benefits of such a process are the etchant is kept contained within the apparatus, insuring that there is no caustic material leaked or spilled, fumes are contained, and a minimal amount of etchant is required in order to affect the same surface properties which previously required significant amounts of fluid to obtain. The cost savings is manifest in the attendant equipment, containment, and associated handling details being significantly reduced. Also, the amount of chemical etchant introduced into the process, and contained can be carefully monitored, the etchant being fully contained within the apparatus the reporting requirements of state, local and federal agencies can be more easily affected. The volume of etchant being carefully monitored, the material can be readily recycled and or filtered and cleaned in order to reduce the amount of etchant requiring replacement due to evaporation, or spillage and loss.

Coating

In another aspect, similar to the cleaning process described above and substituting a coating agent to be applied, panels can be accurately coated with minimal cost and tighter constraints on contaminants, as embodied in U.S. patent application Ser. Nos. 11/274,513—Devitt "Non-Contact Porous Air Bearing and Glass Flattening Device" and 60/625,583—Devitt "Non-Contact vacuum preloaded porous air bearings for creating conveyors to support, transport or process thin materials and work pieces used in manufacturing displays"

In this method the air supplied to the hydrostatic bearings is temperature-controlled in preparation for a coating supplied by an axial slit type applicator. The hydrostatic bearing on the top surface of the substrate is configured with numerous evenly placed holes along grooves longitudinally along the bearings, in the direction of the substrate processing direction. The holes supply a vacuum force which is substantially greater than the weight of the substrate, effectively pulling the glass against the hydrostatic bearing lands for a precise gap between the bearing and the substrate. This enables the substrate to be introduced to the slit coater with micron level precision in the distance to the slit coater. This distance from the substrate to the coating orifice is important with certain types of coatings and insures an accurate thickness layer is applied. After the coating head, there are no longer any vacuum grooves in the hydrostatic bearing which is holding the glass up against it; in fact the preferred embodiment is to have nothing near the substrate coating, so effectively a space is created within the apparatus, allowing the substrate coating to dry. The substrate is transported by a lower hydrostatic bearing which supports the substrate as it is "handed off" from the upper hydrostatic bearing, through the coater, then to be supported by the lower hydrostatic bearing. This allows the coating to dry properly as well as avoid transcription effects which can occur should there be any temperature variations on the surface of the substrate during and after the coating process. The apparatus could then conceivably incorporate various drying and baking or further etching elements in order to enhance the coating performance.

In still another embodiment, in an arrangement similar to the cleaning process, the substrate is constrained hydrostatically via the coating material to be applied with said coating material forced from a higher pressure groove between the gap in the substrate and porous material, against the direction of the substrate travel into a lower pressure groove. The thickness of the gap between the porous media and the substrate can be adjusted to modulate the allowable amount of coating to be applied to the substrate.

Baking

In yet another embodiment to the process similarly described above under Drying, there are no axial grooves in the hydrostatic bearings, merely a cutout similar to that described above in the application of coating utilizing Constant vapor deposition. However here there is simply a high heat source specifically for the purpose of baking the substrate, whether to cure a coating, prepare the substrate for some other process requiring high heat, or for further processes inherent in the manufacturing process. The high heat source can, as described above, be situated on both sides of the substrate—above and below, and can be of numerous different means, including but not limited to radiant heat, infra-red drying, and plasma radiation.

Combination of Stages

Within the manufacturing arena, floor space of machinery used to process the FPD sheets or substrates within a clean room environment is costly due to the necessary processes required in maintaining such an environment. Any way to minimize the amount of floor space required is advantageous. For this reason, a further aspect of the apparatus is the inline coordination and inclusion of each element described above, the resulting savings in floor space within the clean room environment is substantial thereby realizing a large cost savings. Also the process is internal to the apparatus realizing significant benefits for the prevention of contamination of the clean room from any attendant aspects of any of the processes, as each stage can be performed on the substrate immediately after the previous one, insuring no contamination of the substrate passing from one operation to another.

Prior to this invention each step is performed separately, within the particular process's own arena on the manufacturing line, thereby requiring significant floor space and the attendant conveyance equipment required to safely transport the substrate between the manufacturing processes. A further aspect of the preferred embodiment entails the processing of substrates and especially large substrates in processes as described above but in an immediately sequential fashion. This includes individually sequential ordering but also is to include simultaneous processing, so that a substrate conceivably could have the 5 (or more) processes, isolated from each other, being performed at once. Such improvements are perceived by its inventor as a significant enhancement in a growing industry which can potentially realize large cost savings while improving overall processes parameters at the same time. The process times may have to be harmonized and more substrate area may be required for exclusion zones but the advantages are still compelling.

It is to be understood that both the foregoing general description and the following detailed description are exemplary and explanatory and are intended to provide a further detailed explanation of the invention as claimed but do not constitute the entirety of potential embodiment.

DETAILED DESCRIPTION OF THE PREFERRED EMBODIMENT

As will be understood by those skilled in the art, the present invention may be embodied in other specific forms or configurations without departing from the essential characteristics or spirit and scope thereof. Accordingly, the foregoing description is intended to be illustrative, but not limiting, of the scope of the invention which is set forth in the following claims. Thus it is intended that the present invention cover the modifications and variations of this intention provided they come within the scope of the appended claims and their equivalents.

Cleaning—Flat Substrate

Figure 1:
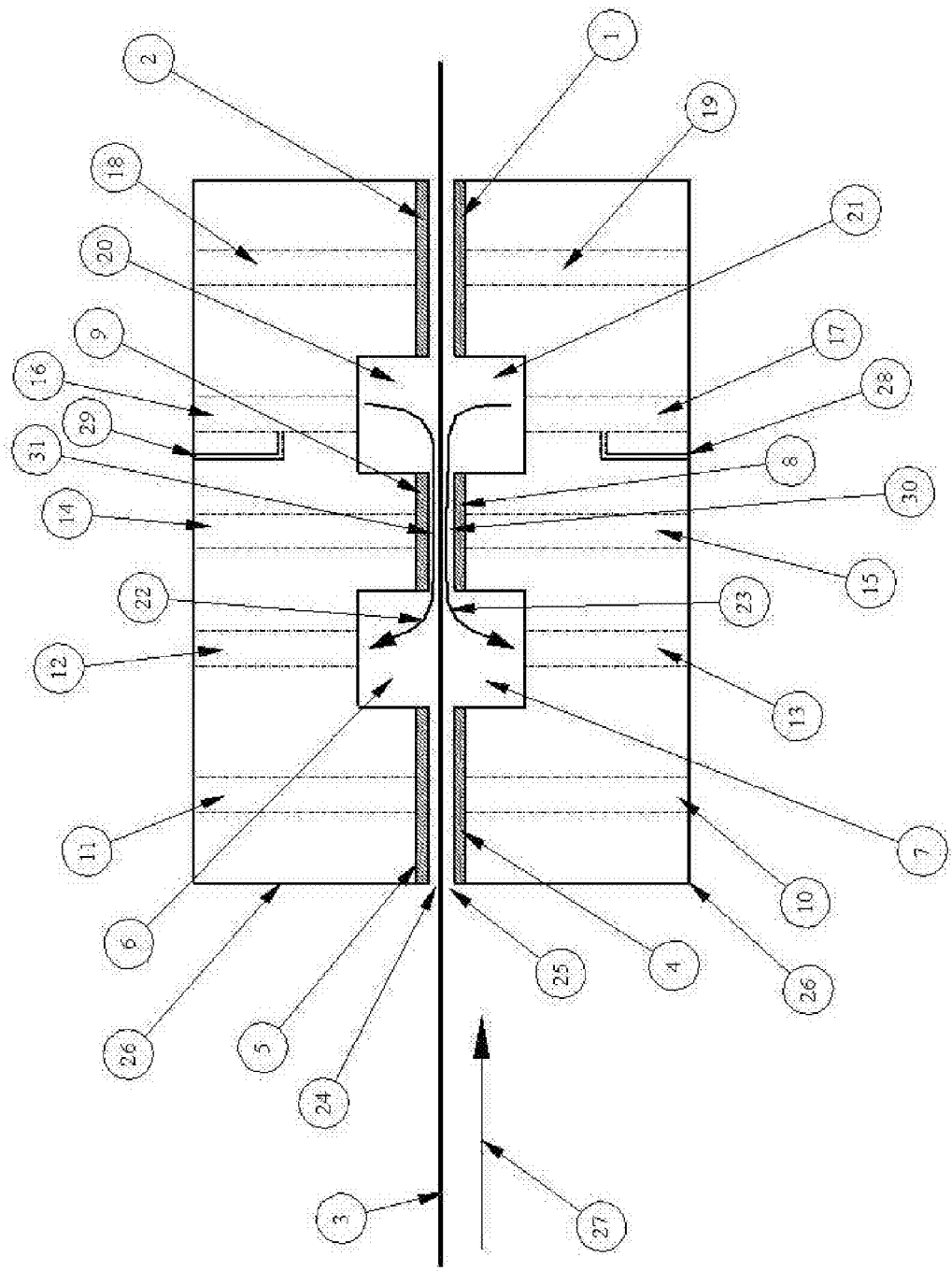
FIG. 1 is a schematic view of a cleaning/drying/etching operation showing the vertically opposed hydrostatic bearings, the substrate, and the attendant pressures from orifices.

Referring to FIG. 1 an upper hydrostatic or aerostatic bearing 5 is vertically disposed opposite a lower hydrostatic bearing 4 between which is supported a glass or other type of substrate 3. The bearing lands are charged with a fluid or air through passages 11, 10 supplied in the apparatus housings 26 at a pressure of anywhere between a few inches of water (less than 1 Psi) to 1000's of pounds per square inch or Psi, but for this embodiment, roughly 30 Psi. The bearings 5, 4 are so disposed around the substrate 3 in such a way as to form narrow gaps 25, 24 which cause equal pressure build up from the bearings, displacing the substrate to a plane, or line that is approximately an equal distance between the two bearings, creating a non-contact situation. This equilibrium is maintained by the hydrostatic bearings 4,5 since if there is a displacement of substrate 3 downward, away from bearing 5, the gap formed 24 between the substrate 3 and the bearing grows, hence there is a decrease in pressure since the fluid will escape via the easiest path which is now the larger gap. The corresponding decrease in gap 25 beneath substrate 3 causes an increase in pressure in the gap since there is less room for the air or gas to escape, thereby forcing the substrate 3 upwards. This in turn causes a type of equilibrium that is self stabilizing between the higher pressure bearing lands and the substrate 3 keeping gaps 24, 25 even. This is well known in the art—see U.S. Pat. No. 5,104,237 Slocum. A set of low pressure grooves 6, 7 are then axially displaced within the apparatus equally disposed on both sides of the substrate. These two grooves are at a substantially lower pressure, conducted by channels 12, 13, than the hydrostatic bearing pressure 11, 10, possibly even near vacuum, or at a few inches of water in measurable pressure. A middle land is then formed with hydrostatic bearings 9, 8 which have significantly the same narrow gap as bearings 5, 4 further indicated by 25, 24. The pressure supplied 14, 15 to these two bearings, 9, 8 can be lower, higher, or substantially the same as the pressures 11, 10 found on the first two bearings, 5, 4, or in this embodiment, approximately 20 Psi. The relationship between hydrostatic bearings drop in output pressure in relation to input pressure is well known in the art. Hydrostatic bearings 9 & 8 in relation to the drop of input pressure via channels 14, 15 as related to the pressure on the bearing surface, means the input pressure needs to be substantially higher than that which is seen on the surface of the bearing. The amount of restriction of the bearing material can be adjusted, as this translates directly to the amount of gap 24, 25 between bearing surface 9, 8 in relation to substrate 3 as a function of area and pressure. In order to obtain the desired functionality, this restriction in the bearing can be adjusted as needed at the time of apparatus manufacture. See U.S. Pat. No. 6,163,033 Smick. Further along the direction of substrate travel 27, is a further set of axially disposed grooves 20, 21 vertically oriented above one another. These grooves, 20, 21 are pressurized via channels 16, 17 without restriction in this example at a pressure of 20 Psi. Also within these grooves 20, 21 a cleaning solution 22, 23 is supplied through orifices 29, 28 which feed into channels 16,17 and become entrained in fluid supplied to grooves 20,21. The cleaning solution is forced out of grooves 20, 21 at a pressure slightly higher than 20 Psi. Hydrostatic bearings 1, 2 placed directly after grooves 20, 21 in the direction 27 of substrate travel, are pressurized 18, 19 at anywhere from 30 Psi or significantly higher than the pressure supplied 16, 17 to grooves 20, 21. The subsequent pressure differential forces cleaning solution 22, 23 against the direction 27 of the substrate, through the narrow gaps 31, 30 created between the substrate 3 and hydrostatic bearings 8, 9, which can be fluid or gas in application. The viscosity of the cleaning solution acts in a shearing action and cleans the substrate 3 of contaminates. The cleaning solution 22, 23 is then forced, via the pressure differential of lands 8,9 into the lower ambient grooves of 6, 7, urged by the low pressure from 12, 13 conducted to the groove. The cleaning solution is then removed to a separate container (not shown) and filtered (not shown). The solution is kept within the apparatus, and contained. A solution may be introduced through 16, 17 without modification or the additions from a duct like 28, 29. Successive cleaning stations can be instituted for different cleaning operations. Also surfactants, various solvents, and de-ionized water can be utilized. In another embodiment the cleaning solution can be supplied via bearings 8, 9 creating effectively hydrostatic bearings. The solution 22, 23 applying equal pressure on either side of the substrate 3, effectively supporting said substrate in a non-contact orientation. The solution 22, 23 is then forced against the direction 27 of the substrate 3 from the higher pressure of axially disposed grooves 20, 21 via pressure supplied 16, 17 which may in this instance be substantially greater than the pressure of the narrow gap 30, 31 formed between hydrostatic bearing lands 8, 9. The solution 22, 23 is forced along the substrate 3 under pressure, thereby scouring the surface of said substrate 3 and removing all debris, oils etc in a cleaning operation. The cleaning fluid 22, 23 is then forced into axial groove 6, 7 and removed via the low pressure ports 12, 13 and then removed to a separate container (not shown) and filtered, recycled (not shown) or disposed of. The substrate 3 is then removed via support of hydrostatic bearings 1, 2 which hold said substrate in a further non-contact orientation. Refer to U.S. Ser. No. 60/625,583—Devitt "Non-Contact vacuum preloaded porous air bearings for creating conveyors to support, transport or process thin materials and work pieces used in manufacturing displays"

In a further embodiment of FIG. 1, an ultrasonic (<500 kHz) or megasonic (>500 kHz) head is mounted (not shown) substantially within bearings 9, 8 (or grooves 20, 21) which in this instance is being used as a hydrostatic bearing, with cleaning solution 22, 23 or water being forced out of the bearing, and applying a force on substrate 3. The megasonic cleaning head being recessed within the bearing land 8, 9 or groove 6,7 and having its surface substantially co-linear and parallel to substrate 3 in the land, very close gaps are able to be maintained, in this instance, equal to thin gaps 24, 25. Since there is a cleaning fluid in-between bearing 8, 9 and substrate 3—the megasonic wave force is applied, both pulsed and continuous type, through the cleaning medium which in turn acts on substrate 3, forming a wave (not shown) which when it impinges substrate 3, forces the cleaning solution 22, 23 to pull away from the surface, thereby forming extremely small cavitation bubbles, which burst causing the viscous force of the bubble to affect cleaning, thereby performing a further cleaning action on said substrate, as already known in the art. Since there is equal force applied from both sides to substrate 3, said substrate remains in a non-contact orientation. In still a further embodiment, bearings 8, 9 are not hydrostatic, but rather aerostatic, and the cleaning solution 22, 23 is supplied via axial grooves 20, 21—and the ultrasonic heads mounted within bearings 8, 9 come in contact with cleaning solution 22, 23 and allow ultrasonic wave forms to be applied to the substrate 3 at a close distance, and safely in relation to the substrate.

Figure 2:
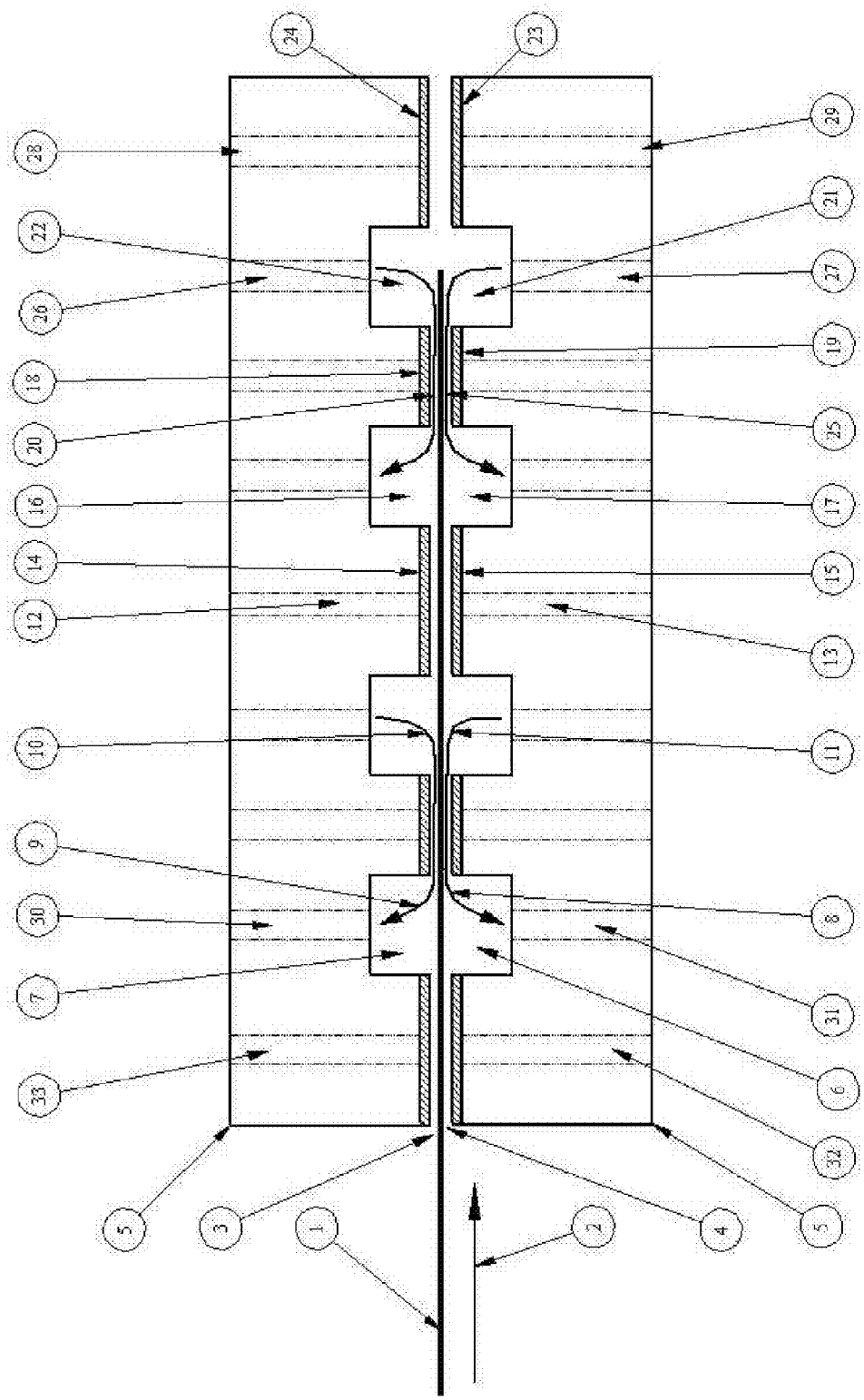
FIG. 2 is a schematic view of a multiple of cleaning/drying/etching operation for a solid substrate showing the vertically opposed hydrostatic bearings, in an immediately sequential embodiment.

A further embodiment of the cleaning method and apparatus constitutes a multiple stage 5, or immediately successive and or simultaneous operations. FIG. 2 illustrates the above detailed and previously explained cleaning operation 9, 8 on substrate 1 with an immediate and simultaneous drying, cleaning, etching, coating or any other type of action that benefits from a viscous shear type affect 20, 25 performed on the same substrate 1 successively, or simultaneously as shown presently in much the same manner as described above in Cleaning, or some as yet invented method unknown presently in the art. The two processes are separated by hydrostatic bearings 14, 15 maintaining gaps 3, 4 between the substrate and bearing surfaces. The separation of the two processes 8, 9 and 20, 25 can be of any desired length, given the operating parameters required. Hydrostatic bearings 14, 15 supplied by channels 13, 12 generate sufficient pressure to prevent cleaning agent 10, 11 from migrating in direction 2 of substrate travel into chambers 16, 17 of the next operation—but instead to be driven by the lower ambient pressure of chambers 6, 7 and evacuated via channels 30, 31. Throughout the two processes, the substrate 1 is maintained in a non-contact orientation maintaining gaps 3, 4 between substrate 1 and the successive hydrostatic bearing lands. The substrate 1 is then conveyed via hydrostatic bearing lands 18, 19 into axially displaced vertically disposed relative to one another, chambers 22, 21 which supply the etchant, forced hot air, coating material etc via channels 26, 27 at a pressure greater than that exists in the hydrostatic bearings 18, 19 thereby forcing the second operation material 20, 25 through the narrow gap 3, 4 maintained between the substrate 1 and hydrostatic bearings 18, 19 against substrate 1 direction 2 creating a viscous shear that acts on substrate 1 for a desired effect. Subsequently, hydrostatic bearings 24, 23 supplied via channels 28, 29 continue to maintain gap 3, 4 with substrate 1 via a compatible fluid to the given application, whether it be air, hydrogen, etchant nitrogen, or cleaning fluid. The substrate 1 can then be conveyed into a further operation (not shown) or out of the machine as a finished piece. The substrate can then be successively rinsed via the same method within the apparatus either simultaneously via further axial grooves in a similar manner, or within a further apparatus (not shown in FIG.).

Drying—Flat Substrate

In the application of drying a substrate, a similar embodiment to the cleaning operation described above, is utilized as in FIG. 1. The substrate 3 passes between a hydrostatic bearing 5 which is vertically disposed opposite a lower hydrostatic bearing 4 between which is carried a glass or other type of substrate 3. The bearings are charged with a gas or air through grooves 11, 10 supplied in the apparatus housing 26 at a pressure of roughly 30 pounds per square inch, or Psi. The bearings 5, 4 are so disposed around the substrate 3 in such a way as to form narrow gaps 25, 24 which create equal pressure build up from the bearings, displacing the substrate into the center of the two bearing lands, creating a non-contact situation, as described above. A set of pressure grooves 6, 7 are then axially displaced within the apparatus equally disposed on both sides of the substrate. These two grooves are at a substantially lower pressure 12, 13 than the hydrostatic bearing pressure 11, 10, possibly even vacuum. A middle land is then formed with hydrostatic bearings 9, 8 which have significantly the same or slightly larger narrow gap as bearings 5, 4 further indicated by 25, 24. The pressure supplied 14, 15 to these two bearings, 9, 8 may be moderately lower than the pressures 11, 10 found on the first two bearings, 5, 4 approximately 20 Psi. Further along the direction of substrate travel 27, are a further set of axially disposed grooves 20, 21 vertically oriented above one another. These grooves, 20, 21 are pressurized via channels 16, 17 at a pressure of 20 Psi. Also within these grooves 20, 21 a medium which may be heated 22, 23 is supplied through orifices 16, 17 and/or 29, 28 which are placed along the grooves (not shown). The heated, or dry air is forced out of grooves 20, 21 at a pressure slightly higher than 20 Psi. Hydrostatic bearings 1, 2 placed directly after grooves 20, 21 in the direction 27 of substrate travel, are pressurized 18, 19 at or significantly higher than the pressure supplied 16, 17 to grooves 20, 21. The subsequent pressure differential forces the heated and dry air 22, 23 against the direction 27 of the substrate, through the narrow gaps 31, 30 created between the substrate 3 and hydrostatic bearings 8, 9. The force of the heated dry air 22, 23 being forced between thin gap 30, 31 acts in a shearing action and cleans the substrate 3 of water or cleaning fluid remaining from a previous cleaning operation (not shown in this embodiment) drying the glass. The heated dry air 22, 23 is then forced, via the pressure differential of lands 8,9 into the lower ambient grooves of 6, 7, urged by the low pressure 12, 13 of the groove. The heated dry air is then removed possibly to a separate filter (not shown) and vented (not shown) in an appropriate manner. The heated exhaust can be kept within the apparatus, thereby maintaining clean room environment integrity and the effluent contained. Successive drying stations can be instituted for different drying operations. In yet another embodiment the drying operation can be supplied via bearings 8, 9 creating effective hydrostatic bearings. The heated fluid, namely air, but possibly other fluid types, 22, 23 applying equal pressure on either side of the substrate 3, effectively supporting said substrate in a non-contact orientation. The heated dry air 22, 23 is then forced against the direction 27 of the substrate 3 from the higher pressure of axially disposed grooves 20, 21 via pressure supplied 16, 17 which may in this instance be substantially greater than the pressure of the narrow gap 30, 31 formed between hydrostatic bearing lands 8, 9 which is typically 50% of input pressure. The heated dry air 22, 23 is forced along the substrate 3 under pressure, thereby fully removing from the surface of said substrate 3 all moisture or liquid fluids. The heated dry air 22, 23 is then forced into axial groove 6, 7 and removed via the low pressure ports 12, 13 and then removed to a separate container (not shown) and possibly vented. The substrate 3 is then removed via support hydrostatic bearings 1, 2 which hold said substrate in a further non-contact orientation. After being cleaned and dried, the substrate 3 is maintained in a non-contact orientation allowing it to remain free from contaminates, foreign debris, and or marks from handling. Additional grooves may be employed to improve the drying action.

Etching—Flat Substrate

In still another embodiment, using FIG. 1 utilizing the now described cleaning/drying method; chemical etchant is substituted for the cleaning solution/heated dry air 22, 23. The etchant is kept contained, evacuated from the apparatus through chambers 6, 7 under lower pressure 12, 13 and contained in an apparatus (not shown) to be filtered, re-charged, and possibly re-utilized within the apparatus, saving etchant and allowing the apparatus to operate safely within a clean room environment. Still another detail within this embodiment is that the chemical etchant solution or gas can be supplied via bearings 8, 9 creating effective hydrostatic bearings. The chemical etchant solution 22, 23 applying equal pressure on either side of the substrate 3, effectively supports said substrate in a non-contact orientation. The solution or gas 22, 23 is then forced against the direction 27 of the substrate 3 from the higher pressure of axially disposed grooves 20, 21 via pressure supplied 16, 17 which may in this instance be substantially greater than the pressure of the narrow gap 30, 31 formed between hydrostatic bearing lands 8, 9. The solution or gas 22, 23 is forced along the substrate 3 under pressure, thereby scouring the surface of said substrate 3 and chemically modifying the surface of the substrate 3 as is desired for specific manufacturing processes. The hydrostatic bearing lands 8, 9 can be so situated to be modified vertically relative to one another and to substrate 3, thereby changing the gap created 30, 31 between the hydrostatic bearings 8, 9 and the substrate 3 itself, allowing modulation of the pressure created between the lands 8, 9 and the substrate 3, as is desirable within the chemical etching process. The speed with which the substrate 3 is moved through apparatus 26 can be modulated as well, in order effect the desired chemical etching process. Subsequently the chemical etching fluid or gas 22, 23 is then forced into axial groove 6, 7 and removed via the low pressure ports 12, 13 and then removed to a separate container (not shown) and filtered (not shown). It is possible that multiple or additional lands and grooves could help isolate different processes and may be added as needed, or they may be employed for multiple and immediately sequential processes as shown in FIG. 2. The substrate 3 is then removed via support hydrostatic bearings 1, 2 which hold said substrate in a further non-contact orientation to insure proper process parameter remain valid. The substrate 3 can then be moved to further cleaning/drying/baking/CVD/PVD operations.

Cleaning—Flexible Substrate.

Figure 3:
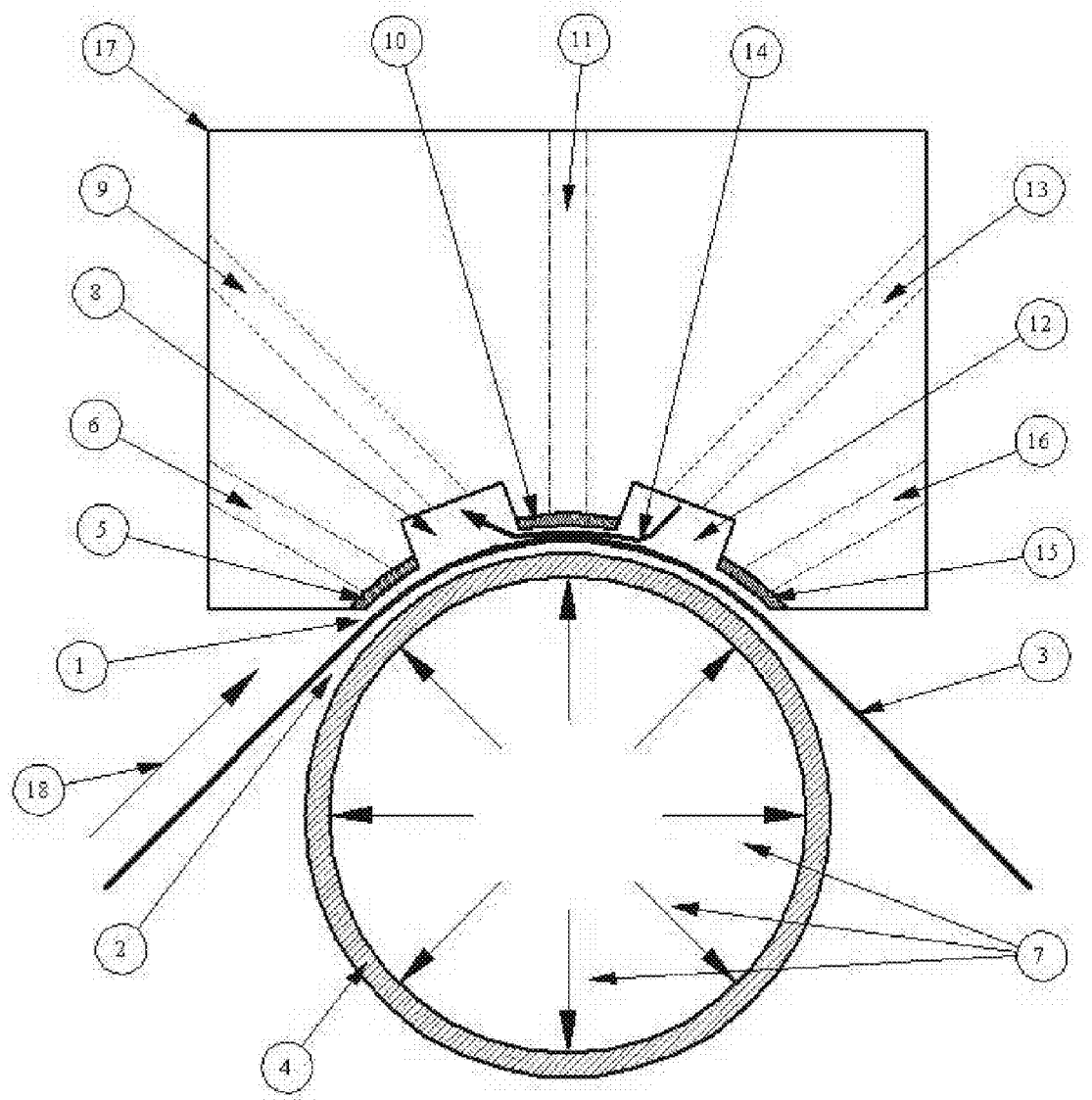
FIG. 3 is a schematic view of a flexible substrate or web of material, and the attendant pressures of areas within an apparatus, however the support apparatus is curved, and the substrate is a web of continuous material.

In a further embodiment, utilizing FIG. 3, similar to the above described cleaning process, a flexible substrate 3 is fed into a gap between curved hydrostatic bearings 4, 5. The web is carried via the impingement of air or fluid upon the web via a porous media in the bearing in which 60 Psi of air or other gas or fluid 7 so that there is no contact between the web substrate 3 and the bearings 4. The web 3 is constrained on its other surface through an hydrostatic bearing 5 under a pressure of 60 Psi via internal grooves 6 within apparatus 17, so that there is no contact with web substrate 3 and bearing 5, leaving a thin gap 1 between the web and the hydrostatic bearing. Bearing 5 is curved in a way to match the radius of bearing 4, forming an annulus so that thin gap 1 remains substantially consistent traversing the face of bearing 5. A similar gap 2 is formed between the web and the curved hydrostatic bearing 4, and it is likewise substantially maintained through the radius of bearing 4, forming an annulus so that thin gap 1 remains substantially consistent traversing the face of bearing 4. Immediately adjacent to hydrostatic bearing 5, in the direction of web travel 18, is an axial groove 8 which is under vacuum or near 0 Psi via a channel 9 connected to some type of vacuum producing device (not shown). Immediately adjacent to channel 9, in the direction of web substrate 3 travel 18 is a hydrostatic bearing 10 fed through a channel 11 in the apparatus 17 with 20 Psi. This bearing 10 is substantially curved to match the surface of the web substrate 3 which is riding on curved bearing 4, so much so that thin gaps 1,2 remain substantially consistent. Immediately adjacent to hydrostatic bearing 10, in the direction of web substrate travel 18 is axial groove 12. This groove 12 is pressurized via tube 13 with 20 Psi. Immediately adjacent to groove 12 in the direction of web substrate travel 18 is hydrostatic bearing 15, pressurized by tube 16 with 60 Psi. Bearing 15 is substantially curved to match the surface of the web substrate 3 which is riding on curved bearing 4, so much so that thin gaps 1, 2 remain substantially consistent.

In the cleaning application, groove 12 is pressurized via channels 13 at a pressure of 20 Psi. Also within these grooves 12 a cleaning solution 14 is supplied through orifices which are axially placed along the width of the groove 12 (not shown). The cleaning solution is forced out of grooves 12 at a pressure slightly higher than 20 Psi. Hydrostatic bearing 10 placed directly after groove 12 in the direction 27 of substrate travel, are pressurized 16 at 60 Psi or significantly higher than the pressure supplied 13 to groove 12. The subsequent pressure differential forces cleaning solution 14 against the direction 18 of the substrate, through the narrow gaps 1,2 created between the substrate 3 and hydrostatic bearing 10 The viscosity of the cleaning solution acts in a shearing action and cleans the substrate 3 of contaminates. The cleaning solution 14 is then forced, via the pressure differential of land 10 into the lower ambient groove of 8, urged by the low pressure 9 of the groove. The cleaning solution is then removed to a separate container (not shown) and filtered (not shown). The solution is kept within the apparatus, and contained. Successive cleaning stations can be instituted for different cleaning operations. Also surfactants, various solvents, and de-ionized water can be utilized. In another embodiment the cleaning solution can be supplied via bearing 10 and passage 11 creating effective hydrostatic bearings. The solution 14 applying equal pressure on the top side of the substrate 3, effectively supported via bearing 4 with an equal pressure in a non-contact orientation. The solution 14 is then forced against the direction 18 of the substrate 3 from the higher pressure of axially disposed groove 12 via pressure supplied 13 which may in this instance be substantially greater than the pressure of the narrow gap 1, 2 formed between hydrostatic bearing lands 10, 4 and web substrate 3. The solution 14 is forced along the substrate 3 under pressure, thereby scouring the surface of said substrate 3 and removing all debris, oils etc in a cleaning operation. The cleaning fluid 14 is then forced into axial groove 8 and removed via the low pressure port 9 and then removed to a separate container (not shown) and filtered (not shown). The substrate 3 is then removed via support hydrostatic bearings 4, 15 which hold said substrate in a further non-contact orientation, until it can be led to another process, stage, or further bearing apparatus. The web substrate can then be led to another non-contact web apparatus which is oriented in a minor fashion, and the opposite side of the web can be treated. One skilled in the art can easily imagine complimentary lands and groove in the outer diameter of four exactly opposite embodiments, as noted in the Rigid embodiment.

In a further embodiment of FIG. 3, an ultrasonic (<500 kHz) or megasonic (>500 kHz) head is mounted (not shown) substantially recessed within bearing 10 which in this instance is being used as a hydrostatic bearing, with cleaning solution 14 or water being forced out of the bearing, and applying a force on substrate 3. The ultrasonic cleaning head being recessed within the bearing 10 and having its surface co-linear and substantially curved to match the surface of the web substrate 3 which is riding on curved bearing 4, so much so that an annulus is formed, and thin gaps 1, 2 remain substantially consistent in relation to substrate 3. Since there is a cleaning fluid in-between bearing 10 and substrate 3—the ultrasonic wave force is applied, both pulsed and continuous type, acting through the cleaning medium which in turn acts on substrate 3, thereby forming a wave (not shown) which when it impinges substrate 3, forces the cleaning solution 14 to pull away from the surface, thereby forming extremely small cavitation bubbles, which burst causing the viscous force of the bubble to affect cleaning (as known in the art), performing a further cleaning action to said substrate surface. Since there is equal force applied from both sides to substrate 3, said substrate remains in a non-contact orientation. In still a further embodiment, bearings 10 are not hydrostatic, but rather aerostatic, and the cleaning solution 14 is supplied via axial grooves 12, 8—and the ultrasonic head mounted within bearings 10 comes in contact with cleaning solution 14 and allow ultrasonic wave forms to be applied to the substrate 3. As noted in the Rigid substrate type embodiment, a further cleaning apparatus can be situated in mirror arrangements, so as to treat the other side of flexible web substrate 3.

Drying—Flexible Substrate

In yet another embodiment referencing FIG. 3, forced hot air can be substituted for the cleaning solution 14. In the drying application, groove 12 is pressurized via channels 13 at a pressure of 20 Psi. Also within the groove 12 a heated dry stream of air 14 or some other gas, such as carbon dioxide, nitrogen, etc heated via numerous different means not here detailed, is supplied through orifices which are axially placed along the width of the groove 12 (not shown). The heated dry air is forced out of groove 12 at a pressure slightly higher than 20 Psi. Hydrostatic bearing 10 placed directly after groove 12 in the direction 27 of substrate travel, is pressurized 16 at 60 Psi or significantly higher than the pressure supplied 13 to groove 12. The subsequent pressure differential forces heated dry air 14 against the direction 18 of the substrate, through the narrow gaps 1,2 created between the substrate 3 and hydrostatic bearing 10 The force of the pressure differential forces the heated dry air to act in a shearing action and cleans the substrate 3 of contaminates. The cleaning solution 14 is then forced, via the pressure differential of land 10 into the lower ambient groove of 8, urged by the low pressure 9 of the groove. The heated dry air is then removed via venting external to the apparatus 17 or to some other desired location (not shown). The heated dry air is retained within the apparatus, and contained, preventing moisture or humid air from escaping the apparatus 17 and potentially contaminating a clean room environment. Successive drying stations can be instituted for different drying operations. In another embodiment the heated dry air can be supplied via bearing 10 and passage 11 creating a further drying condition. The heated dry air 14 applying equal pressure on the top side of the substrate 3 effectively supported via bearing 4 with an equal pressure in a non-contact orientation. The heated dry air 14 is then forced against the direction 18 of the substrate 3 from the higher pressure of axially disposed groove 12 via pressure supplied 13 which may in this instance be substantially greater than the pressure of the narrow gap 1, 2 formed between bearing lands 10, 4 and web substrate 3. The heated dry air 14 is then forced along the substrate 3 under pressure, thereby scouring the surface of said substrate 3 and removing all liquid in a drying operation. The heated dry air 14 is then forced into axial groove 8 and removed via the low pressure port 9 and vented (not shown). The substrate 3 is then removed via support hydrostatic bearings 4, 15 which hold said substrate in a further non-contact orientation, until it can be led to another process, stage, or further bearing apparatus. It should be noted that the drying operation can occur without the use of heat, simply the shearing force of air applied against the substrate, as it transitions the narrow gaps of the bearing lands. The web substrate can then be led to another non-contact web apparatus which is oriented in a minor fashion, and the opposite side of the web can be treated if required.

Etching—Flexible Substrates

In still another embodiment, using FIG. 3 utilizing the now described cleaning/drying method; chemical etchant is substituted for the cleaning solution/dry air 14. The etchant is kept contained, evacuated from the apparatus through chambers 8 under lower pressure 9 and contained in an apparatus (not shown) to be filtered, re-charged, and possibly re-utilized within the apparatus, saving etchant and allowing the apparatus to operate safely within a clean room environment. Also, the etchant is able to be tracked as far as its disposition to comply with various State, Local and Federal regulations. Still another detail within this embodiment is that the chemical etchant solution can be supplied via bearing 10 and 4 creating an effective hydrostatic bearing. The chemical etchant solution 14 applying pressure on the top side of the substrate 3, is effectively matched via hydrostatic bearing 4 supporting said substrate in a non-contact orientation. The solution 14 is then forced against the direction 18 of the substrate 3 from the higher pressure of axially disposed groove 12 via pressure supplied 13 which may in this instance be substantially greater than the pressure of the narrow gap 1,2 formed between hydrostatic bearing lands 10, 4. The solution 14 is forced along the substrate 3 under pressure, thereby scouring the surface of said substrate 3 and chemically modifying the surface of the substrate 3 as is desired for a given manufacturing processes. The now hydrostatic bearing land 10 can be so situated to be modified vertically relative to bearing 4 and to substrate 3, thereby changing the gap created 1, 2 between the hydrostatic bearings 10, 4 and the substrate 3 itself, allowing modulation of the pressure created between the lands 10, 4 and the substrate 3, as is desirable within the chemical etching process. The speed with which the substrate 3 is moved through apparatus 26 can be modulated as well, in order effect the desired chemical etching process. Subsequently the chemical etching fluid 14 is then forced into axial groove 8 and removed via the low pressure port 9 and then removed to a separate container (not shown) and filtered (not shown). The substrate 3 is then removed via support hydrostatic bearings 15, 4 which hold said substrate in a further non-contact orientation to insure proper process parameters remain valid. The substrate 3 can then be moved to further cleaning/drying/baking/CVD operations, successively, sequentially or independently, as is desired for a given process.

Combination of Stages—Flexible Substrates

Figure 4:
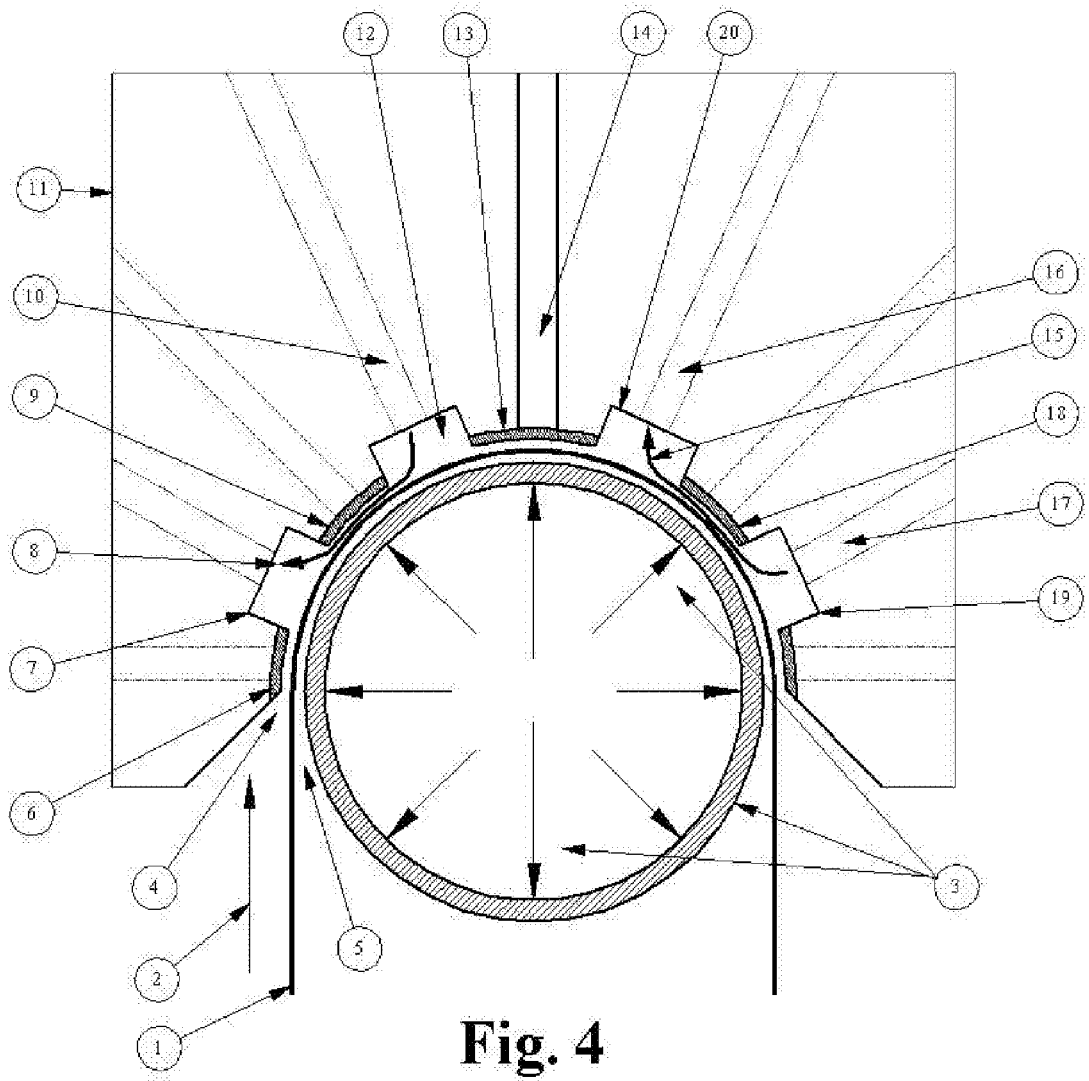
FIG. 4 is a schematic view of a flexible substrate or web of material in a cleaning/drying operation that is an immediately sequential embodiment and/or simultaneous.

As can be seen by FIG. 4 a multi stage process method and is incorporated into the previously described Flexible Substrate—cleaning embodiment detailed above into apparatus 11. Substrate web 1 traveling in direction 2 is born via hydrostatic bearing 3 creating gaps 4, 5 which are consistently maintained throughout the course of the substrates processing, remaining non contact and substantially uniform in height in relation to other bearings and lands. The substrate is constrained via hydrostatic bearing 6 and conveyed into chamber 7 where cleaning, etching, baking, drying operation 8 is performed via the narrow gap formed by substrate 1 and bearing land 9, while material 8 is forced in the opposite direction of substrate 1 travel 2, via pressure from chamber 12 while supplied via channel 10 with either the cleaning solution, etchant, etc. Further in direction of substrate 1 travel 2 is a hydrostatic bearing 13 land, immediately positioned next to chamber 12 supplied via channel 14 at a pressure that is greater than that supplied to chamber 12, insuring that there is no transcription, or transference of material 8 in the direction of substrate 1 travel 2. This higher pressure, possibly 60 Psi, but conceivable higher, or lower as required for a given process creates a seal all while maintaining gap 4 between the substrate 1 and bearing land 13. Immediately sequential, but possibly further along in direction of substrate 1 travel 2 is another axial disposed chamber, or groove, or feature, in which a second operation is performed on the same web of substrate 1. The operation 15 can be further cleaning, etching, baking, coating, drying, or any other conceivable process, embodied in the same manner as previously described, via hydrostatic bearing 18 constraining substrate 1 and forming a narrow gap 4 in which material 15 is forced opposite to substrate 1 travel 2 utilizing the viscous shear affect in a thing gap cross section, while maintaining a non-contact orientation of substrate 1. Chamber 20 being at a lower pressure than chamber 19, as has been previously described, above.

Figure 5:
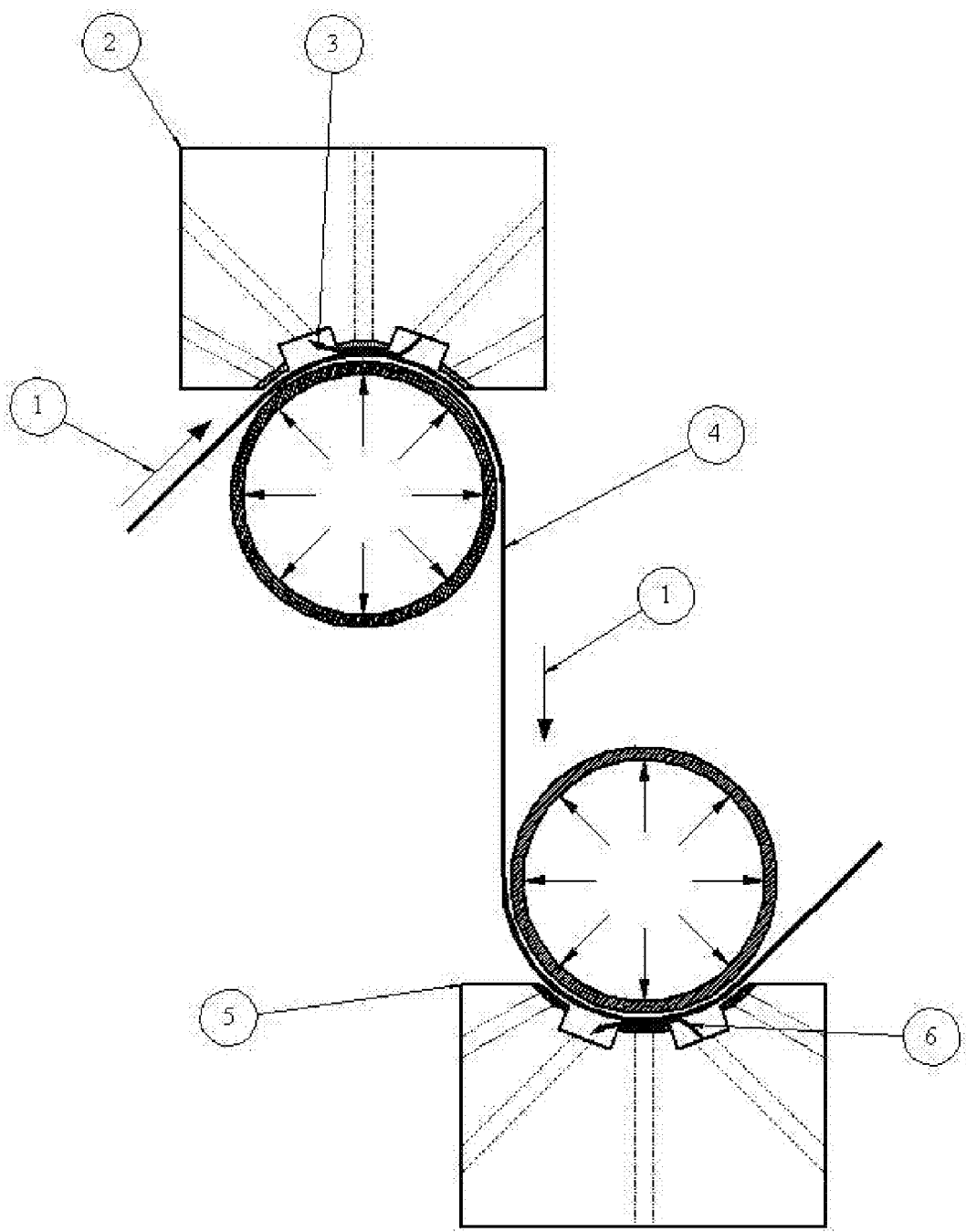
FIG. 5 is a schematic view of a further embodiment of a flexible substrate or web of material in a cleaning/drying operation that is separate, yet immediately sequential and/or simultaneous.

FIG. 5, Flexible Substrate—cleaning, 2 is coupled simultaneously with Coating—Flexible substrates 5, upon the same web of flexible substrate 4. The cleaning process 3 is followed immediately after with the drying process 6 on the substrate 4 in direction 1. As may be deduced from the art any type of process may be substituted for the drying 6 process, such as etching, coating, baking, or even further cleaning. As should be apparent to one skilled in the art, multiple stages of various different processes may be utilized in the present disclosure simultaneously, or independently, or in multiple configurations for the purpose of manufacturing flexible web utilizing cleaning, etching, drying, baking, coating etc. It may also be readily observed that the patentee desires to anticipate further developments in the art of flexible substrates that are currently not invented, and should be considered as a possible further manufacturing or processing step by those familiar with the art regarding the proposed apparatus and or method in simultaneous fashion or successively, as well as in this patent regarding successive and simultaneous processing of flexible substrates through gaps employing the viscous shear affect of the various fluids used in the process.

Figure 6:
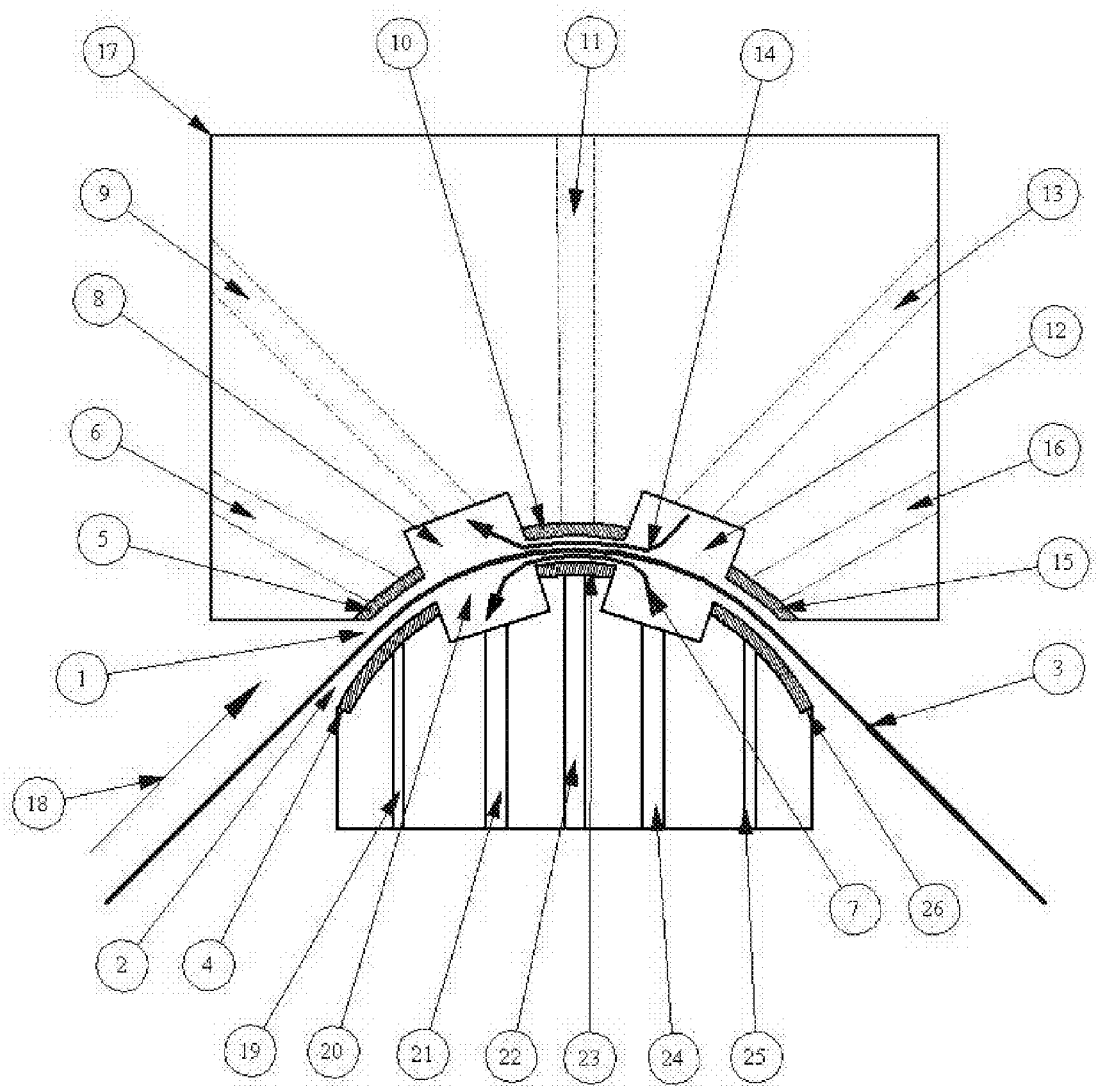
FIG. 6 is a schematic view of a further embodiment of a flexible substrate or web material in a cleaning/drying/coating separate utilizing a minor array of axially placed grooves for treating the top and bottom surfaces of a moving web or flexible substrate simultaneously.

In FIG. 6, a minor type arrangement is detailed showing a viscous shear fluid 7 being exerted on the underside of flexible substrate or web 3 simultaneously as a fluid 14, heated air, cleaning fluid, etc. is being exerted on the top surface of flexible substrate 3. Hydrostatic bearing lands 10, 23 maintain the substrate 3 in equilibrium through precise control of pressure via channels 11, 22, with fluids 14, 7 evacuated via the now described lower pressure axial chambers 8, 20. The substrate is then contained and further carried via hydrostatic lands 5, 4. As has been described previously, numerous fluid, heating, cleaning combinations may be performed via this embodiment.

Summation

It will be readily apparent to those skilled in the art that various modifications and variations can be made in the apparatus for cleaning, drying, baking, and etching glass substrate and semi-conductor industry wafers of the present invention without departing from the spirit or scope of the invention. Thus, it is intended that the present invention cover the modifications and variations possible of this invention in method and or apparatus provided they come within the scope of the claims and appended claims and their equivalents.

What is claimed is:

1. A method for cleaning a substrate, the method comprising:
   providing a pair of hydrostatic or aerostatic bearings, at least one of said pair of hydrostatic bearings being configured for applying a cleaning solution under pressure, so as to define a gap between the bearings, at least one of said bearings having a plurality of axial grooves and lands, the axial grooves extending perpendicularly to a direction of movement of the substrate and spanning substantially a full width of the substrate;
   introducing the substrate into the gap;
   levitating and controlling a position of the substrate while cleaning the substrate by hydrostatically or aerostatically forcing the cleaning solution through said at least one of the bearings to at least one side of the substrate so that the substrate is centrally displaced relative to the bearings; and
   forcing the cleaning fluid using a pressure differential between the grooves in a direction opposite to a direction of movement of the substrate to use a viscous shear force of the cleaning solution to dislodge and clean a surface of said substrate.

2. The substrate cleaning method according to claim 1, wherein said cleaning solution is then forced into a further axial groove which has a substantially lower pressure than the grooves through which the cleaning solution is forced, whereby the cleaning solution is removed from the surface of the substrate by vacuum force.

3. The method of claim 1, wherein the bearings comprise aerostatic bearings.

4. The method of claim 3, wherein the aerostatic bearing lands are combined with an ultrasonic and or megasonic cleaning apparatus which act upon the surface of the substrate while immersed in said cleaning fluid.

5. The method of claim 4, wherein the ultrasonic or megasonic cleaning apparatus is disposed in a chamber in at least one of the bearings.

6. The method of claim 4, wherein the ultrasonic or megasonic cleaning apparatus is disposed in at least one of the aerostatic bearing lands.

7. The method of claim 1, further comprising introducing an etchant to chemically alter or treat the surface of a substrate.

8. The method of claim 7, wherein the etchant is introduced into grooves in the bearings, said etchant then being forced into a lower pressure axial groove and contained by said lower pressure axial groove, from which said etchant is forced through vacuum pressure into a containment device.

9. The method of claim 8, further comprising monitoring an amount of said etchant in said containment device.

10. The method of claim 1, wherein the complete process is contained and not exposed to ambient air, thereby allowing for precise control of substrate temperature and ambient humidity.

11. The method of claim 1, wherein a cleaning solution is introduced into grooves, said cleaning solution then being forced into a lower pressure axial groove and contained by said lower pressure axial groove, from which said cleaning fluid is forced through vacuum pressure into a containment device.

12. The method according to claim 1, further comprising forcing pressurized and/or heated dry air on one or both sides of the substrate, forcing the cleaning fluid be removed from the surface of said substrate into an axially placed groove of substantially lower pressure than a surrounding portion of one of the bearings, said axially placed groove being situated up stream from a direction of travel of the substrate, electively forcing any fluids or contaminates to be evacuated via a vacuum effect of said groove.

13. The method according to claim 1, further comprising forcing pressurized and/or heated dry air from the bearings to control a temperature of the substrate.

14. The method of claim 1, wherein the bearings comprise a porous material.

15. The method of claim 1, wherein the substrate is flat.

16. The method of claim 1, wherein the step of levitating comprises cleaning the substrate by hydrostatically or aerostatically forcing the cleaning solution through the bearings to both sides of the substrate.

17. The method of claim 1, wherein the cleaning fluid is a liquid.

18. A method for performing a plurality of processes on a substrate, the method comprising:
   providing a pair of hydrostatic or aerostatic bearings, at least one of said pair of hydrostatic bearings being configured for applying a plurality of fluids for performing the plurality of processes under pressure, so as to define a gap between the bearings, at least one of said bearings having a plurality of axial grooves and lands, the axial grooves extending perpendicularly to a direction of movement of the substrate and spanning substantially a full width of the substrate;
   introducing the substrate into the gap;
   levitating and controlling a position of the substrate while processing the substrate by hydrostatically or aerostatically forcing each of the fluids through said at least one of the bearings to at least one side of the substrate so that the substrate is centrally displaced relative to the bearings; and
   forcing each of the fluids using a pressure differential between the grooves in a direction opposite to a direction of movement of the substrate to use a viscous shear force of each of the fluids to process the substrate.

19. The method of claim 18, wherein the plurality of processes are performed in succession.

20. The method of claim 18, wherein the step of levitating comprises cleaning the substrate by hydrostatically or aerostatically forcing each of the fluids through the bearings to both sides of the substrate.

21. A method for performing a process on a substrate, the method comprising:
   providing a pair of hydrostatic or aerostatic bearings, at least one of said pair of hydrostatic bearings being configured for applying a fluid for performing the process under pressure, so as to define a gap between the bearings, at least one of said bearings having a plurality of axial grooves and lands, the axial grooves extending perpendicularly to a direction of movement of the substrate and spanning substantially a full width of the substrate;

introducing the substrate into the gap;

levitating and controlling a position of the substrate while processing the substrate by hydrostatically or aerostatically forcing the fluid through said at least one of the bearings to at least one side of the substrate so that the substrate is centrally displaced relative to the bearings; and forcing the fluid using a pressure differential between the grooves in a direction opposite to a direction of movement of the substrate to use a viscous shear force of the fluid to process the substrate.

22. The method of claim 21, wherein the substrate is flat.

23. The method of claim 21, wherein the step of levitating comprises hydrostatically or aerostatically forcing the fluid through the bearings to both sides of the substrate.

24. The method of claim 21, wherein a temperature-controlled fluid is used to apply said viscous shear force to control a temperature of the substrate.

25. A method for cleaning a substrate, the method comprising:

providing a pair of hydrostatic bearings, at least one of said pair of hydrostatic bearings being configured for applying as liquid cleaning solution under pressure, so as to define a gap between the bearings;

introducing the substrate into the gap;

levitating and controlling a position of the substrate while cleaning the substrate by hydrostatically forcing the cleaning solution through at least one of the bearings to at least one side of the substrate so that the substrate is centrally displaced relative to the hydrostatic bearings; and forcing the cleaning fluid using a pressure differential between the grooves in a direction opposite to a direction of movement of the substrate to use a viscous shear force of the cleaning solution to dislodge and clean a surface of said substrate.

* * * * *